(12) United States Patent
Hatano

(10) Patent No.: US 9,871,088 B2
(45) Date of Patent: Jan. 16, 2018

(54) LIGHT-EMITTING DEVICE AND MANUFACTURING METHOD THEREOF

(71) Applicant: Semiconductor Energy Laboratory Co., Ltd., Kanagawa-ken (JP)

(72) Inventor: Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/162,806

(22) Filed: May 24, 2016

(65) Prior Publication Data

US 2016/0268363 A1    Sep. 15, 2016

Related U.S. Application Data

(63) Continuation of application No. 13/454,248, filed on Apr. 24, 2012, now Pat. No. 9,356,255.

(30) Foreign Application Priority Data

Apr. 27, 2011 (JP) ................................. 2011-099992

(51) Int. Cl.

| | | |
|---|---|---|
| H01L 27/148 | (2006.01) | |
| H01L 27/12 | (2006.01) | |
| H01L 27/32 | (2006.01) | |
| H01L 51/52 | (2006.01) | |

(52) U.S. Cl.
CPC ...... *H01L 27/3272* (2013.01); *H01L 27/1214* (2013.01); *H01L 27/3211* (2013.01); *H01L 27/3251* (2013.01); *H01L 27/3258* (2013.01); *H01L 27/3262* (2013.01); *H01L 27/3274* (2013.01); *H01L 51/525* (2013.01); *H01L 51/5253* (2013.01)

(58) Field of Classification Search
CPC ............. H01L 27/3272; H01L 51/5253; H01L 27/3262; H01L 27/3258; H01L 27/3211; H01L 27/1214; H01L 27/3274; H01L 27/3251; H01L 51/525
See application file for complete search history.

(56) References Cited

U.S. PATENT DOCUMENTS

| | | |
|---|---|---|
| 6,469,439 B2 | 10/2002 | Himeshima et al. |
| 6,614,174 B1 | 9/2003 | Urabe et al. |
| 6,768,257 B1 | 7/2004 | Yamada et al. |

(Continued)

FOREIGN PATENT DOCUMENTS

| | | |
|---|---|---|
| EP | 1 710 851 A2 | 10/2006 |
| JP | 11-339958 A | 12/1999 |

(Continued)

*Primary Examiner* — Su C Kim
(74) *Attorney, Agent, or Firm* — Husch Blackwell LLP

(57) ABSTRACT

When a hollow structure in which a light-emitting element is provided between a pair of substrates is used in order to prevent oxygen or moisture from reaching the light-emitting element, light leakage to an adjacent pixel easily occurs as compared to a structure in which a space between a pair of substrates is filled with a resin such as an adhesive. In order to reduce light leakage to an adjacent pixel in the hollow structure, a light-blocking spacer is formed over a partition to keep the distance between the pair of substrates uniform. The cross-sectional shape of the light-blocking spacer is a trapezoid having a lower side shorter than an upper side.

25 Claims, 6 Drawing Sheets

(56) References Cited

U.S. PATENT DOCUMENTS

| | | |
|---|---|---|
| 6,833,668 B1 | 12/2004 | Yamada et al. |
| 7,388,329 B2 | 6/2008 | Kim et al. |
| 7,697,106 B2 | 4/2010 | Sawasaki et al. |
| 7,753,751 B2 | 7/2010 | Yamazaki |
| 2001/0004469 A1 | 6/2001 | Himeshima et al. |
| 2002/0158570 A1 | 10/2002 | Yamada et al. |
| 2006/0215105 A1* | 9/2006 | Hsiao .................. G02F 1/13394 349/155 |
| 2007/0009677 A1 | 1/2007 | Ebisu et al. |
| 2007/0152537 A1 | 7/2007 | Yamaguchi et al. |
| 2008/0105875 A1 | 5/2008 | Maekawa et al. |
| 2008/0150419 A1 | 6/2008 | Kang |
| 2008/0237805 A1 | 10/2008 | Ohnuma |
| 2008/0246905 A1 | 10/2008 | Chen et al. |
| 2009/0022909 A1* | 1/2009 | Kim .................... C09D 105/12 428/1.5 |
| 2009/0066884 A1 | 3/2009 | Okabe et al. |
| 2009/0284139 A1* | 11/2009 | Ushikubo ........... H01L 51/5036 313/504 |
| 2010/0096655 A1* | 4/2010 | Lee ..................... H01L 27/3253 257/98 |
| 2010/0127615 A1 | 5/2010 | Kim et al. |
| 2010/0176720 A1 | 7/2010 | Yamazaki |
| 2011/0024732 A1 | 2/2011 | Ohsawa et al. |
| 2011/0032465 A1 | 2/2011 | Seong et al. |
| 2011/0084290 A1 | 4/2011 | Nakamura et al. |
| 2011/0109611 A1 | 5/2011 | Nakamura |

FOREIGN PATENT DOCUMENTS

| | | |
|---|---|---|
| JP | 2000-129419 A | 5/2000 |
| JP | 2001-148291 A | 5/2001 |
| JP | 2001-195008 A | 7/2001 |
| JP | 2001-201750 A | 7/2001 |
| JP | 2002-299044 A | 10/2002 |
| JP | 2003-059671 A | 2/2003 |
| JP | 2003-243171 A | 8/2003 |
| JP | 2006-126817 A | 5/2006 |
| JP | 2006-294612 A | 10/2006 |
| JP | 2007-157404 A | 6/2007 |
| JP | 2010-237384 A | 10/2010 |
| JP | 2011-076760 A | 4/2011 |
| WO | WO 2009/122998 A1 | 10/2009 |

* cited by examiner

LIGHT-EMITTING DEVICE AND MANUFACTURING METHOD THEREOF

This application is a continuation of copending U.S. application Ser. No. 13/454,248, filed on Apr. 24, 2012 which is incorporated herein by reference.

BACKGROUND OF THE INVENTION

1. Field of the Invention

The present invention relates to a light-emitting device in which a layer including an organic compound serves as a light-emitting layer and a method for manufacturing the light-emitting device.

2. Description of the Related Art

A light-emitting element containing an organic compound as a luminous body, which has features such as thinness, lightness, high-speed response, and DC drive at a low voltage, is expected to be applied to a next-generation flat panel display or a next-generation lighting device.

A light-emitting mechanism of a light-emitting element is as follows: a voltage is applied between a pair of electrodes where a layer containing an organic compound is interposed, electrons injected from a cathode and holes injected from an anode are recombined with each other at an emitting center of the layer containing an organic compound (also referred to as an EL layer) to form molecular excitons, and the molecular excitons release energy in returning to a ground state to emit light. Singlet excitation and triplet excitation are known as excited states, and light emission can probably be achieved through either of the excited states.

An EL layer has a structure typified by a stacked structure of a hole-transport layer, a light-emitting layer, and an electron-transport layer. EL materials for forming EL layers are roughly classified into low molecular (monomer) materials and high (polymer) molecular materials. An evaporation apparatus is used for film formation of the low molecular material.

In addition, a light-emitting element including a cathode, an EL layer, and an anode is called an EL element. There are two types of the EL elements: a type where an EL layer is formed between two kinds of stripe electrodes that are provided crosswise (simple matrix type); and a type where an EL layer is formed between pixel electrodes that are connected to TFTs and arranged in matrix and counter electrodes (active matrix type). However, when the pixel density is increased, the active matrix type where each pixel (or each dot) is provided with a switch is considered to be advantageous because it can be driven at a lower voltage.

An EL material forming an EL layer deteriorates very easily and deteriorates by easily oxidizing or absorbing moisture under the presence of oxygen or water. Therefore, there are problems in that the luminance of light emission and the lifetime of a light-emitting element decrease. Therefore, by covering of a light-emitting element with a sealing can, enclosure of dry air inside the sealing can, and attachment of a drying agent, oxygen or moisture is prevented from reaching the light-emitting element.

Further, a structure in which a spacer is provided over an insulating layer serving as a partition covering the periphery of a pixel electrode layer is disclosed in Patent Document 1.

REFERENCE

Patent Document

[Patent Document 1] Japanese Published Patent Application No. 2006-126817

SUMMARY OF THE INVENTION

A conventional active matrix light-emitting device includes a light-emitting element in which an electrode electrically connected to a TFT over a substrate is formed as an anode, a layer containing an organic compound is formed over the anode, and a cathode is formed over the layer containing an organic compound. In the conventional active matrix light-emitting device, light generated in the layer containing an organic compound is extracted to the TFT side through the anode that is a transparent electrode (hereinafter, such a structure is referred to as a bottom emission structure).

However, in this structure, there is a problem in that an aperture ratio is limited because of arrangement of a TFT, a wiring, and the like in a pixel portion when resolution is improved.

In view of the above, an active matrix light-emitting device including a light-emitting element having a structure in which an electrode electrically connected to a TFT over a substrate is formed as an anode on the TFT side, a layer containing an organic compound is formed over the anode, and a cathode that is a transparent electrode is formed over the layer containing an organic compound (hereinafter, such a structure is referred to as a top emission structure) is manufactured.

In a top emission structure, the number of material layers through which light emitted from a layer containing an organic compound passes can be reduced as compared to a bottom emission structure, and thus, stray light between material layers having different refractive indices can be suppressed.

Further, when a hollow structure in which a light-emitting element is provided between a pair of substrates is used in order to prevent oxygen or moisture from reaching the light-emitting element, light leakage to an adjacent pixel easily occurs as compared to a structure in which a space between a pair of substrates is filled with a resin such as an adhesive. In particular, as the space between the pair of substrates becomes larger, light leakage to an adjacent pixel is increased.

Further, as the size of a pixel or a gap between pixels is reduced for the purpose of realizing high definition display, light leakage to an adjacent pixel easily occurs; thus, display quality of a light-emitting device might be degraded due to color mixing, color shift, and the like in display.

Therefore, an object of an embodiment of the present invention is to provide a structure in which light leakage to an adjacent pixel is reduced.

Further, in the case of a hollow structure in which a light-emitting element is provided between a pair of substrates, it is also an object to provide a structure in which the distance between the pair of substrates can be kept uniform when the distance between the pair of substrates is greater than or equal to 2 µm, or even greater than or equal to 3 µm.

In order to reduce light leakage to an adjacent pixel, a light-blocking spacer is formed over a partition to keep a distance between a pair of substrates uniform.

An embodiment of the present invention is a light-emitting device including a first substrate; a transistor over the first substrate; a first electrode connected to the transistor; a layer containing an organic compound over the first electrode; a second electrode over the layer containing an organic compound; a partition covering a periphery of the first electrode; a light-blocking spacer over the partition; a second substrate fixed to the first substrate; and a black matrix and a coloring layer in contact with the second substrate. The black matrix overlaps with the second electrode over the light-blocking spacer. The coloring layer overlaps with the first electrode.

The pair of substrates is attached to each other so that the light-blocking spacer is arranged to overlap with the black matrix provided between coloring layers (also referred to as color filters). Full color display is performed using three pixels of a red pixel, a blue pixel, and a green pixel with the use of three coloring layers. Light emitted from a light-emitting element is white light. When the light passes through one of the three coloring layers and the second substrate, light having a desired color is obtained. A shape of a top surface of the light-blocking spacer is a linear shape, a net-like shape, a grid shape, or a linear shape having a branched protruding portion.

A material which absorbs light and has a light-blocking property is used for the light-blocking spacer. For example, a black organic resin can be used, which can be formed by mixing a black resin of a pigment material, carbon black, titanium black, or the like into a resin material such as photosensitive or non-photosensitive polyimide. In the case where a black resin is used, the thickness thereof is greater than or equal to 1 µm and less than or equal to 5 µm, and the resistivity thereof is higher than or equal to $1 \times 10^5$ Ωcm. The light-blocking spacer can absorb white light emitted from a light-emitting element obliquely with respect to a flat surface of the substrate and prevent light leakage in which light passes through a coloring layer of an adjacent pixel. Accordingly, the light-blocking spacer can suppress reduction of chromaticity due to light leakage.

Further, a cross-sectional shape of the light-blocking spacer is a trapezoid having a lower side shorter than an upper side. Specifically, a side surface of the light-blocking spacer forms an angle θ of greater than or equal to 90° with the flat surface of the substrate. When the cross section has such a shape, a first part of the layer containing an organic compound, which is formed on the side surface of the light-blocking spacer, is thinner than a second part of the layer containing an organic compound in a light-emitting region (a region overlapping with the first electrode) to have high resistance; accordingly, current is prevented from flowing into an adjacent pixel. Particularly in the case where a layer having high conductivity is provided as one of layers included in the layer containing an organic compound, when part of the layer having high conductivity, which is formed on the side surface of the light-blocking spacer, is thin, current does not easily flow into an adjacent pixel, which is effective. Note that the first part of the layer containing an organic compound, which is formed on the side surface of the light-blocking spacer, is not necessarily thin; the layer containing an organic compound may be divided on the side surface of the light-blocking spacer. In the case where the layer containing an organic compound is divided, current flowing into an adjacent pixel through the layer containing an organic compound as a current path can be prevented.

Further, the layer containing an organic compound and the second electrode are formed over a top surface of the light-blocking spacer. Moreover, the pair of substrates is fixed to each other so that the black matrix is arranged to be in contact with and overlap with the second electrode over the light-blocking spacer.

The black matrix and the coloring layer may be covered with a protective layer formed using an inorganic material such as silicon oxide so that the reliability of the light-emitting element is prevented from decreasing due to degasification of the black matrix and the coloring layer. In this case, the second electrode is not in contact with the black matrix and the protective layer is provided between the second electrode and the black matrix.

Further, a space between the first substrate and the second substrate is a reduced-pressure space, or is filled with an inert gas. When a nitrogen gas which hardly contains moisture is used as an inert gas filling the space between the pair of substrates, the reliability of the light-emitting element can be increased.

A transparent substrate, typically a glass substrate is used as each of the first substrate and the second substrate, and the substrates are fixed to each other with the use of a sealant or glass with a low melting point, referred to as frit glass. In the case where frit glass is used, a pattern of a closed curve is formed with the use of the frit glass along an edge of one of the glass substrates, baking is performed at approximately 450° C., the pattern is pressed against the other of glass substrates, and the pattern and the other of the glass substrates are welded together by laser welding; thus, a highly airtight glass sealed body is formed. Note that in the case where a pattern of a frit glass is formed over the second substrate, heating by laser or a lamp is performed on only a region where the pattern is formed since the frit glass is baked after the black matrix and the coloring layer are formed.

Further, the first electrode is electrically connected to the transistor. Moreover, a plurality of transistors is included in one pixel.

The transistor includes a semiconductor layer as an active layer. A semiconductor film containing silicon as its main component, a semiconductor film containing an organic material as its main component, or a semiconductor film containing a metal oxide as its main component can be used as the semiconductor layer. As for the semiconductor film containing silicon as its main component, an amorphous semiconductor film, a semiconductor film having a crystal structure, a film of a compound semiconductor having an amorphous structure, or the like can be used; specifically, amorphous silicon, microcrystalline silicon, polycrystalline silicon, single crystal silicon, or the like can be used. Further, for the semiconductor film containing a metal oxide as its main component, zinc oxide (ZnO), an oxide of zinc, gallium, and indium (In—Ga—Zn—O), an oxide of zinc, tin, and indium (In—Sn—Zn—O), or the like can be used.

Alternatively, a transistor which is formed using a substrate of a semiconductor such as silicon or an SOI substrate can be used.

A black matrix, a light-blocking spacer, and a partition overlap with one another, whereby a panel structure in which a space between a pair of substrates can be kept uniform can be provided when the space between the pair of substrates is greater than or equal to 2 µm or even greater than or equal to 3 µm. Further, for a display device including a light-emitting element, a panel structure in which light leakage to an adjacent pixel is reduced can be provided.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
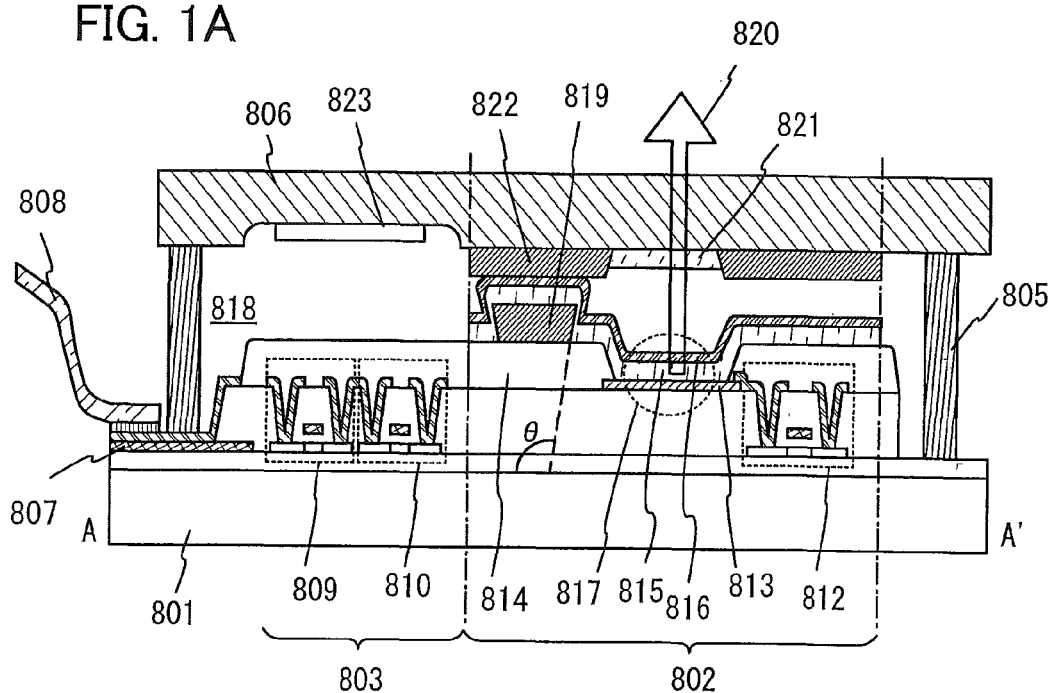
FIGS. 1A and 1B are a cross-sectional view and a top view illustrating an embodiment of the present invention.
Figure 1B:
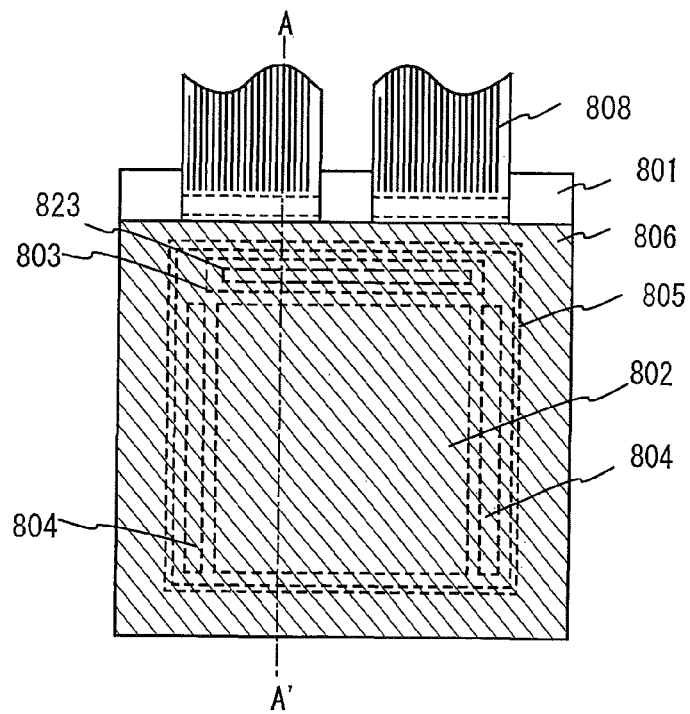

An example of an active matrix light-emitting device will be described with reference to FIGS. 1A and 1B. Note that FIG. 1B is a plan view of a light-emitting device and FIG. 1A is a cross-sectional view taken along dashed line A-A' in FIG. 1B.

The active matrix light-emitting device of this embodiment includes a pixel portion 802 provided over a glass substrate 801, a driver circuit portion (a source line driver circuit) 803, and a driver circuit portion (a gate line driver circuit) 804. The pixel portion 802, the driver circuit portion 803, and the driver circuit portion 804 are sealed in a space surrounded by a fixing portion 805, the glass substrate 801, and a glass substrate 806. In the glass substrate 806, a depression portion (also referred to as a drilled hole) is formed in a region other than a region overlapping with the pixel portion 802, and a desiccant 823 is provided for the depression portion for ensuring reliability of the light-emitting element.

Over the glass substrate 801, a lead wiring 807 for connecting an external input terminal through which a signal (e.g., a video signal, a clock signal, a start signal, a reset signal, or the like) or a potential from the outside is transmitted to the driver circuit portion 803 and the driver circuit portion 804 is provided. Here, an example is described in which an FPC 808 is provided as the external input terminal. Note that although only an FPC is illustrated here, a printed wiring board (PWB) may be attached to the FPC. In this specification, the light-emitting device includes in its category the light-emitting device itself and the light-emitting device on which the FPC or the PWB is mounted.

Next, a cross-sectional structure of the active matrix light-emitting device is described with reference to FIG. 1A. Although the driver circuit portion 803, the driver circuit portion 804, and the pixel portion 802 are formed over the glass substrate 801, the pixel portion 802 and the driver circuit portion 803 which is the source line driver circuit are illustrated in FIG. 1A.

An example is illustrated in which the driver circuit portion 803 includes a CMOS circuit which is a combination of an n-channel transistor 809 and a p-channel transistor 810. Note that a circuit included in the driver circuit portion can be formed using various types of circuits such as a CMOS circuit, a PMOS circuit, or an NMOS circuit. In this embodiment, a driver-integrated type in which a driver circuit and the pixel portion are formed over the same substrate is described; however, the present invention is not limited to this structure, and a driver circuit can be formed over a substrate that is different from the substrate over which a pixel portion is formed.

The pixel portion 802 includes a plurality of pixels each including a switching transistor, a current control transistor 812, and an anode 813 electrically connected to a wiring (a source electrode or a drain electrode) of the current control transistor 812. A partition 814 is formed to cover an end portion of the anode 813. In this embodiment, the partition 814 is formed using a positive photosensitive acrylic resin.

Note that top-gate transistors are illustrated as the transistors such as the switching transistor and the current control transistor 812; however, the structure of the transistors is not limited to the top-gate structure. For example, a bottom-gate transistor such as an inverted staggered transistor may be used.

A material of a semiconductor layer used for each of the transistors is not particularly limited. The semiconductor layer is formed by a known method. Here, a semiconductor film having a crystal structure is used, which is formed in such a manner that an amorphous silicon film is formed by a known method (e.g., a sputtering method, an LPCVD method, or a plasma CVD method), and then the amorphous silicon film is crystallized by known crystallization treatment (e.g., a laser crystallization method, a thermal crystallization method, or a thermal crystallization method using a catalyst such as nickel). The plurality of semiconductor layers serves as active layers of transistors to be formed later. It is preferable to use a semiconductor film having a crystal structure for an active layer of a transistor in order to realize high-speed driving of a driver circuit.

A light-emitting element 817 includes the anode 813, a layer containing an organic compound (EL layer) 815, and a cathode 816. The structure, the material, and the like of the light-emitting element are as described above. Although not illustrated, the cathode 816 is electrically connected to the FPC 808 which is an external input terminal.

The partition 814 is provided at the end portion of the anode 813 to cover the peripheral portion of the anode 813. In addition, in order that the cathode 816 formed over the partition 814 favorably covers the partition 814, the partition 814 is preferably formed so as to have a curved surface with curvature at an upper end portion or a lower end portion. For example, it is preferable that the upper end portion or the lower end portion of the partition 814 have a curved surface with a radius of curvature (0.2 μm to 3 μm). The partition 814 can be formed using an organic compound such as a negative photosensitive resin which becomes insoluble in an etchant by light or a positive photosensitive resin which becomes soluble in an etchant by light, or an inorganic compound such as silicon oxide or silicon oxynitride.

A light-blocking 819 is provided over the partition 814. The light-blocking spacer 819 is formed using a material which absorbs light and has a light-blocking property. For example, a black organic resin is used. The light-blocking spacer 819 absorbs light emitted from the light-emitting element 817 obliquely to the flat surface of the substrate and can prevent light leakage in which light passes through a coloring layer of an adjacent pixel.

Figure 2A:
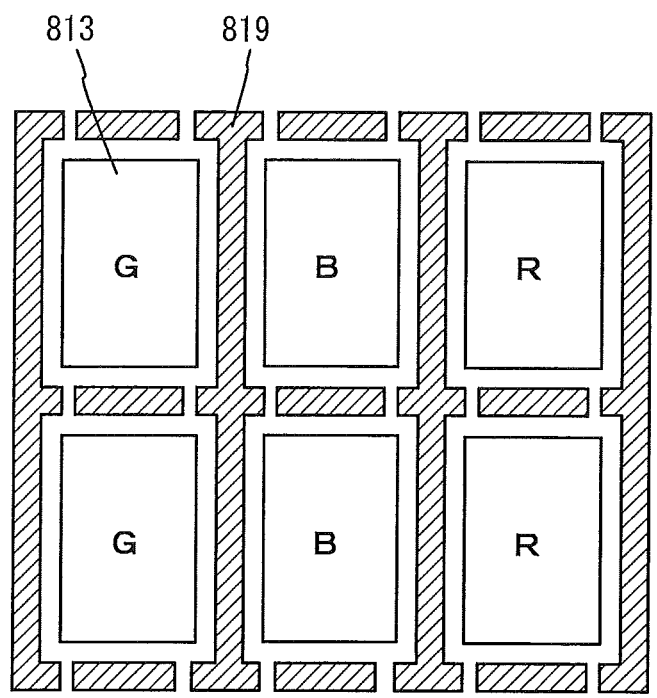
FIGS. 2A and 2B are each an example of a top view illustrating an embodiment of the present invention.

FIG. 2A is an example of a top view showing shapes of top surfaces of the light-blocking spacers 819 and a positional relation between the light-blocking spacers 819 and the anodes 813. Note that in FIG. 2A, two kinds of light-blocking spacers 819, which have different shapes of the top surfaces, are illustrated. The light-blocking spacers 819 are each provided between pixels. FIG. 2A illustrates the light-blocking spacer 819 which has a linear shape with a width of 5 μm to 10 μm and the light-blocking spacer 819 which has a linear shape with a width of 5 µm to 10 µm and includes a branched portion. The branched portion of the light-blocking spacer 819 has a function of supporting a long and narrow spacer with a width of approximately 5 µm.

Figure 2B:
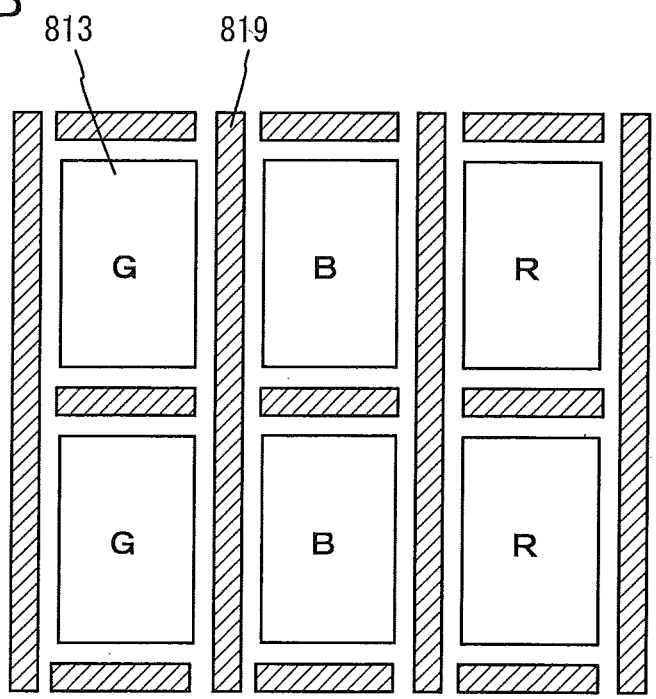
Figure 3:
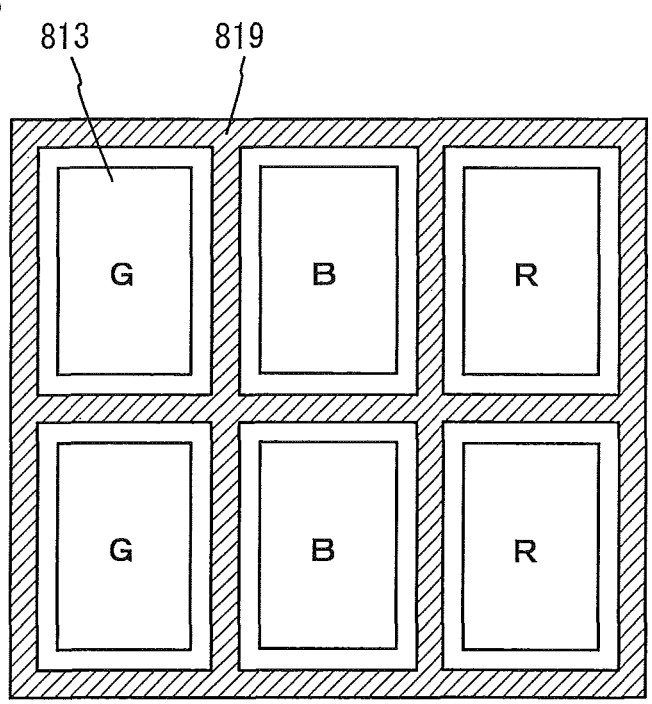
FIG. 3 is an example of a top view illustrating an embodiment of the present invention.

Further, the shape of the top surface of the light-blocking spacer 819 is not limited to the one illustrated in FIG. 2A. For example, the light-blocking spacers 819 which have liner shapes having different lengths may be arranged as illustrated in FIG. 2B. Further, as illustrated in FIG. 3, one light-blocking spacer 819, which has a net-like shape, may be provided. Note that in FIG. 3, voltage might drop significantly due to an increase of resistance of the cathode 816; therefore, it is preferable that a region where the spacer 819 is not provided be formed around a corner of a pixel, as illustrated in FIGS. 2A and 2B.

Further, as illustrated in FIG. 1A, the cross-sectional shape of the light-blocking spacer 819 is a trapezoid having a lower side shorter than an upper side. Specifically, a side surface of the light-blocking spacer 819 forms an angle θ of greater than or equal to 90° with the flat surface of the glass substrate 801. With such a cross-sectional shape, part of the layer 815 containing an organic compound, which is formed on the side surface of the light-blocking spacer 819, can be thinner than part of the layer 815 containing an organic compound in a light-emitting region (a region overlapping with the anode 813) to have high resistance; thus, current can be prevented from flowing into an adjacent pixel. A region having high resistance can be formed on the side surface of the light-blocking spacer 819 or between adjacent spacers; thus, in the case where a cathode and an anode are short circuited for some reason, a short circuit of adjacent pixels caused due to heat generation, which might cause damage spread, can be prevented.

Further, the layer 815 containing an organic compound and the cathode 816 are formed over the top surface of the light-blocking spacer 819. The pair of substrates is fixed by the fixing portion 805 so that the black matrix 822 is in contact with and overlaps with the cathode 816 over the light-blocking spacer 819. The fixing portion 805 may be formed using a sealant of an ultraviolet curable resin, a thermosetting resin, or the like, or may be formed in such a manner that a frit glass is welded by laser.

In this embodiment, an acrylic photocurable resin or an acrylic thermosetting resin is used as the sealant. After a seal pattern is formed over the second substrate, the pair of substrates is attached to each other under a reduced pressure, and ultraviolet irradiation or heat treatment is performed; thus, the sealant is cured to form the fixing portion 805. This sealant is formed into a closed loop and surrounds the pixel portion 802. As the sealant, a sealant containing filler (with a diameter of 1 µm to 5 µm) and having a viscosity of 40 Pa·s to 400 Pa·s is used.

Although the cross-sectional view of FIG. 1A illustrates only one light-emitting element 817, a plurality of light-emitting elements is arranged in matrix in the pixel portion 802. For example, a plurality of light-emitting elements each emitting white light is provided in the pixel portion 802 and three kinds of coloring layers 821 (R, G, B) each overlapping with the light-emitting element are provided; thus, a light-emitting device capable of full color display can be provided. The light-emitting device has a top emission structure; light is emitted from the light-emitting element 817 in the direction indicated by an arrow 820 in FIG. 1A.

The light-emitting element 817 is formed in a closed space 818 that is surrounded by the glass substrate 801, the glass substrate 806, and the fixing portion 805. The closed space 818 is filled with an inert gas in which moisture is sufficiently reduced.

As described above, the active matrix light-emitting device according to an embodiment of the present invention can be obtained. Such a light-emitting device has a long lifetime.

Embodiment 2

In this embodiment, a specific example of a stack of the layer 815 containing an organic compound described in Embodiment 1 will be described with reference to FIG. 4.

Over a first electrode layer 103, a hole-injection layer 141, a first light-emitting unit 142, an intermediate layer 143, a second light-emitting unit 144, an intermediate layer 145, a third light-emitting unit 146, an electron-injection layer 147, and a second electrode layer 107 are stacked in this order. For the first electrode layer 103, an element belonging to Group 1 or 2 of the periodic table, that is, an alkali metal such as lithium (Li) or cesium (Cs), an alkaline earth metal such as calcium (Ca) or strontium (Sr), or magnesium (Mg) can be used. Further, an alloy containing an alkali metal, an alkaline earth metal, or magnesium (e.g., MgAg or AlLi) can be used. Moreover, a rare earth metal such as europium (Eu) or ytterbium (Yb), or an alloy containing a rare earth metal can also be used. Alternatively, a variety of conductive materials such as Al, Ag, and ITO can be used for the first electrode layer 103. A metal, an alloy, a conductive compound, or a mixture thereof is preferably used for the second electrode layer 107. Specifically, indium tin oxide (ITO), indium tin oxide containing silicon or silicon oxide, indium zinc oxide, indium oxide containing tungsten oxide and zinc oxide (IWZO), or the like can be given. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used for the second electrode layer 107.

Each of the first light-emitting unit 142, the second light-emitting unit 144, and the third light-emitting unit 146 includes at least a light-emitting layer containing a light-emitting substance, and may have a structure in which a layer other than the light-emitting layer and the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, a layer containing a substance having a bipolar property (a substance having a high electron-transport property and a high hole-transport property), and the like. As a light-emitting substance, for example, a fluorescent compound which emits fluorescence or a phosphorescent compound which emits phosphorescence can be used. The use of phosphorescent compounds for emission of all of red (R) light, green (G) light, and blue (B) light makes it possible to obtain high luminous efficiency.

Figure 4:
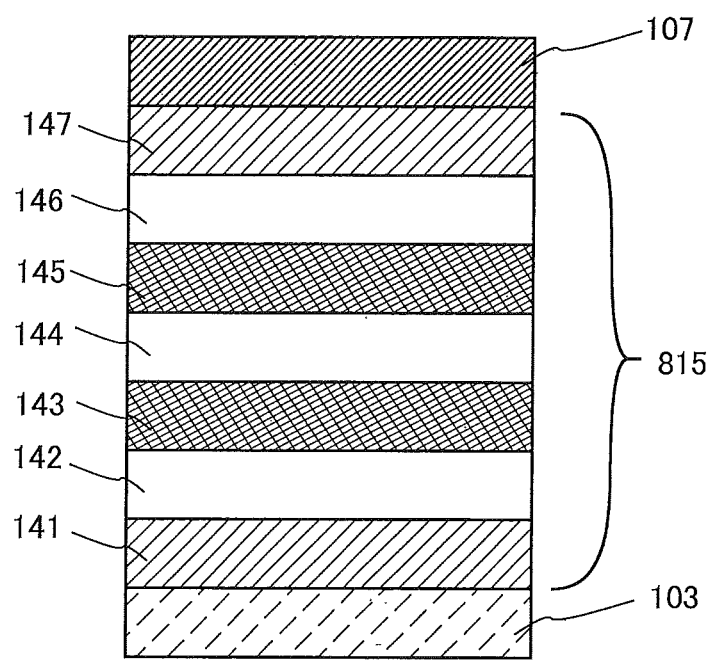
FIG. 4 is an example of a structure of a light-emitting element according to an embodiment of the present invention.

FIG. 4 illustrates a stacked element in which three units, which are the first light-emitting unit 142, the second light-emitting unit 144, and the third light-emitting unit 146, are stacked. In the case of the stacked element, a color of light emitted from the first light-emitting unit 142, a color of light emitted from the second light-emitting unit 144, and a color of light emitted from the third light-emitting unit 146 are complementary colors to one another; thus, white light emission can be extracted to the outside. Note that also in the case where the first light-emitting unit 142, the second light-emitting unit 144, and the third light-emitting unit 146 each include a plurality of light-emitting layers which emits light of complementary colors to one another, white light emission can be obtained. As a complementary relation, blue and yellow, blue green and red, and the like can be given.

The hole-injection layer 141 is a layer containing a substance having a high hole-injection property. As the substance having a high hole-injection property, for example, molybdenum oxide, vanadium oxide, ruthenium oxide, tungsten oxide, manganese oxide, or the like can be used. Besides the above, phthalocyanine based compounds such as phthalocyanine ($H_2Pc$) and copper phthalocyanine (CuPc) can be used.

For the hole-injection layer 141, a composite material in which an acceptor substance is added to an organic compound having a high hole-transport property is preferably used. Such a composite material can be formed by co-evaporation of a substance having a high hole-transport property and an acceptor substance. In this embodiment, a composite material of molybdenum oxide and an aromatic amine compound is used for the hole-injection layer 141.

The intermediate layer 143 and the intermediate layer 145 are each formed to include at least a charge generation region, and may have a stacked structure of the charge generation region and a layer other than the charge generation region. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that the acceptor substance is preferably added to the charge generation region so that the mass ratio of the acceptor substance to the substance having a high hole-transport property is from 0.1:1 to 4.0:1. As the acceptor substance that is used for the charge production region, a transition metal oxide can be given. Specifically, molybdenum oxide is particularly preferable. Note that molybdenum oxide has a low hygroscopic property. As the substance having a high hole-transport property used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ $cm^2/Vs$ or higher is preferably used. However, a substance other than the above-described materials may also be used as long as the substance has a higher hole-transport property than an electron-transport property.

The electron-injection layer 147 is a layer containing a substance having a high electron-injection property. As the substance having a high electron-injection property, the following can be given: an alkali metal, an alkaline earth metal, and a compound thereof, such as lithium (Li), cesium (Cs), calcium (Ca), lithium fluoride (LiF), cesium fluoride (CsF), and calcium fluoride ($CaF_2$). Alternatively, a layer containing a substance having an electron-transport property and an alkali metal, an alkaline earth metal, magnesium (Mg), or a compound thereof (e.g., Alq containing magnesium (Mg)) can be used. In this embodiment, a composite material of molybdenum oxide and an aromatic amine compound is used for the electron-injection layer 147 so that damage due to sputtering in formation of the second electrode layer 107 can be reduced.

When a charge generation layer is provided as one layer included in the layer 815 containing an organic compound as illustrated in FIG. 4, an element can have both high luminance and a long lifetime while the current density is kept low. In addition, the voltage drop due to resistance of the electrode material can be reduced, whereby uniform light emission in a large area is possible.

Since the light-emitting element in this embodiment is a top-emission light-emitting element, an optical path adjusting film may be formed over the first electrode layer 103 so that light emitted from the layer 815 containing an organic compound and light reflected by the first electrode layer 103 interfere with each other and light having a specific wavelength is strengthened. The optical path adjusting film is preferably formed with a film which has a light-transmitting property and does not affect carrier injection to the layer 815 containing an organic compound.

Since the intermediate layer 143 and the intermediate layer 145 have high conductivity, it is important to provide the light-blocking spacer 819 over the partition 814 as illustrated in FIG. 1A. Since the intermediate layer 143 and the intermediate layer 145 are provided over the partition which is provided between pixels, current might flow into an adjacent pixel and an unintended pixel might emit light unless the light-blocking spacer 819 is provided, although it depends on a distance between the pixels.

The cross-sectional shape of the light-blocking spacer 819 is such that the side surface of the light-blocking spacer 819 forms an angle θ of greater than or equal to 90° with the flat surface of the substrate. With the light-blocking spacer 819 having such a cross-sectional shape, the layer 815 containing an organic compound formed on the side surface of the light-blocking spacer 819 can be made thin; accordingly, the intermediate layer 143 and the intermediate layer 145 can be made thin and the resistance of the layer 815 containing an organic compound can be increased.

Figure 5A:
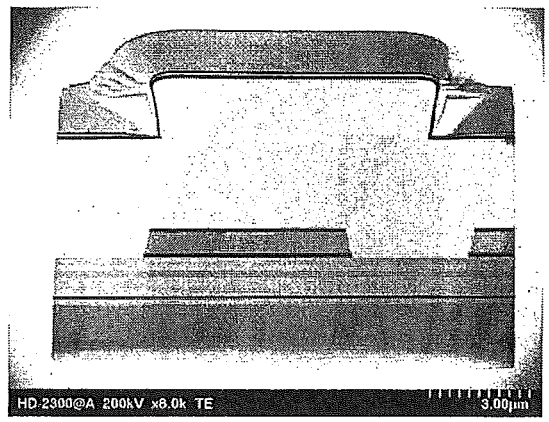
FIGS. 5A and 5B are photographs of a cross section of a spacer and FIG. 5C is a schematic view thereof.

An actual state where a spacer is formed and a layer containing an organic compound is evaporated is described below. FIG. 5A is a cross-sectional TEM image in which a layer containing an organic compound is formed over a spacer in which a side surface thereof forms an angle θ of approximately 100° with a flat surface of a substrate.

In FIG. 5A, the height of the spacer is approximately 1.8 µm and the total thickness of the layer containing an organic compound is approximately 210 nm. A first electrode is a stack of a Ti film having a thickness of 50 nm, an Al film having a thickness of 200 nm, and a Ti film having a thickness of 3 nm. The thickness of an ITO film which is a second electrode is approximately 70 nm.

Figure 5B:
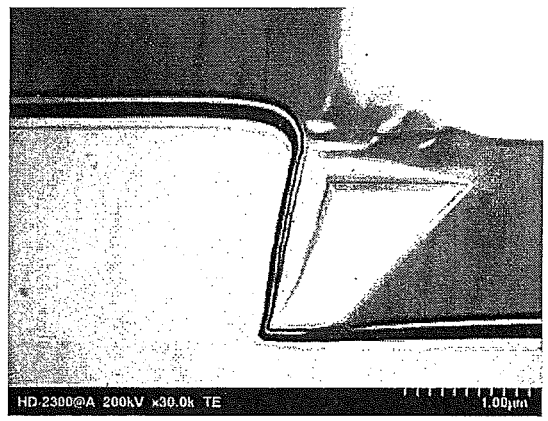
Figure 5C:
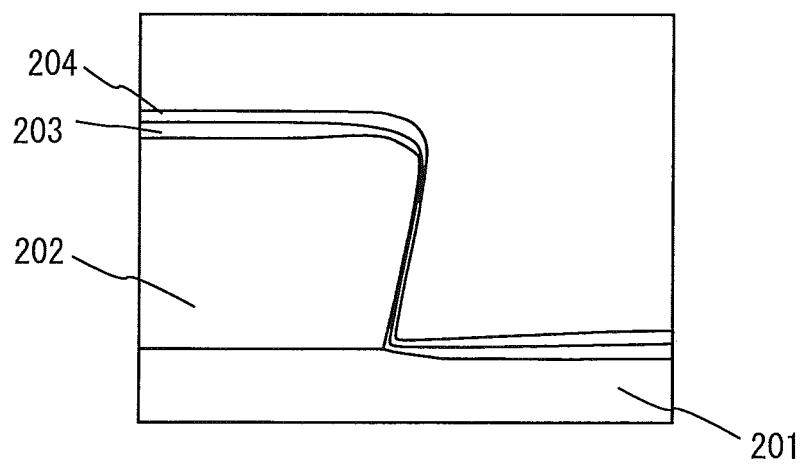

FIG. 5B is an enlarged TEM image of part of FIG. 5A. FIG. 5C is a schematic view of FIG. 5B. As shown in FIGS. 5B and 5C, a thin layer 203 containing an organic compound formed on is formed also on a side surface of a spacer 202, and it can be confirmed that the thickness of part of the layer 203 containing an organic compound on the side surface of the spacer is reduced to approximately 40 nm, which is approximately one fifth of part of the layer 203 having a thickness of approximately 210 nm over the spacer. Further, the thickness of the ITO film which is a second electrode 204 on the side surface of the spacer 202 is also reduced.

According to this result, when a side surface of a spacer forms an angle θ of greater than or equal to 90° with a flat surface of a substrate, part of the layer 203 containing an organic compound, which is formed on the side surface of the spacer, is made thin and part of the intermediate layers 143 and 145 having high conductivity can be accordingly made thin to have high resistance; thus, light emission from an adjacent pixel can be prevented. Note that the spacer in FIGS. 5A and 5B is formed using an acrylic resin, which does not have a light-blocking property. The spacer obtains a light-blocking property by dispersion a material which does not transmit light or absorbs light; thus, light leakage to an adjacent pixel can be suppressed. As a material of a light-blocking spacer, a material in which a material which does not transmit light or absorbs light is dispersed in a resin such as an epoxy resin, an acrylic resin, an acrylic epoxy resin, a siloxane polymer-based resin, or a polyimide resin can be used. As the material which is dispersed in a resin, carbon black, titanium oxide, titanium oxynitride, or the like can be used. The light-blocking spacer is preferably has high resistivity; specifically, a material having a resistivity of $1 \times 10^5$ Ωcm is used. In the stacked structure illustrated in FIG. 4, a composite material of molybdenum oxide and an aromatic amine compound, which is used for the hole-injection layer 141, has a resistivity of $1 \times 10^5$ Ωcm; therefore, the light-blocking spacer is formed using a material having resistivity higher than the composite material.

Note that this embodiment can be freely combined with Embodiment 1.

Embodiment 3

In this embodiment, specific examples of electronic devices each of which is manufactured using the light-emitting device described in the above embodiments will be described with reference to FIGS. 6A to 6D.

Examples of electronic devices to which the present invention can be applied include a television set (also referred to as a television or a television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), a housing of a game machine, and the like. Specific examples of these electronic devices are shown in FIGS. 6A to 6D.

Figure 6A:
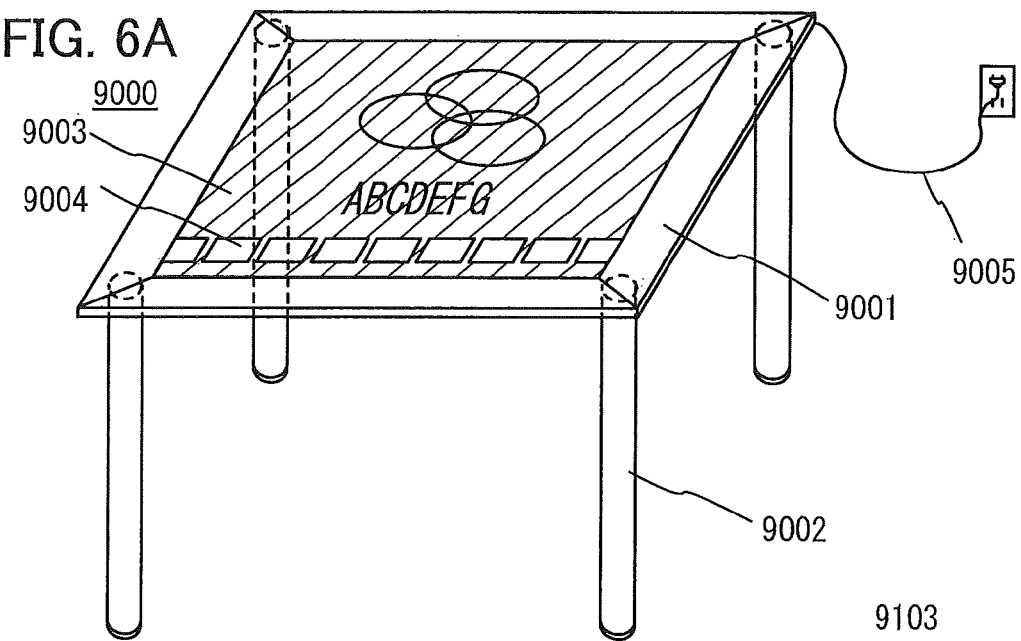
FIGS. 6A to 6D each illustrate an example of an electronic device according to an embodiment of the present invention.

FIG. 6A illustrates a table 9000 having a display portion. In the table 9000, a display portion 9003 is incorporated into a housing 9001. A light-emitting device manufactured according to an embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch input function. When a display button 9004 displayed on the display portion 9003 of the table 9000 is touched by a finger or the like, a screen can be operated or data can be input. Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

The light-emitting device including the light-blocking spacer, which is described in the above embodiments, is employed, whereby color mixing, color shift, or the like in display does not easily occur; therefore, when the light-emitting device is used for the display portion 9003, the display portion 9003 can have display quality higher than a conventional display portion. In addition, the pair of substrates is supported by the light-blocking spacer, so that the light-emitting device is extremely resistant to external force such as impact, distortion, or the like. Thus, the light-emitting device can be favorably used for the table illustrated in FIG. 6A.

Figure 6B:
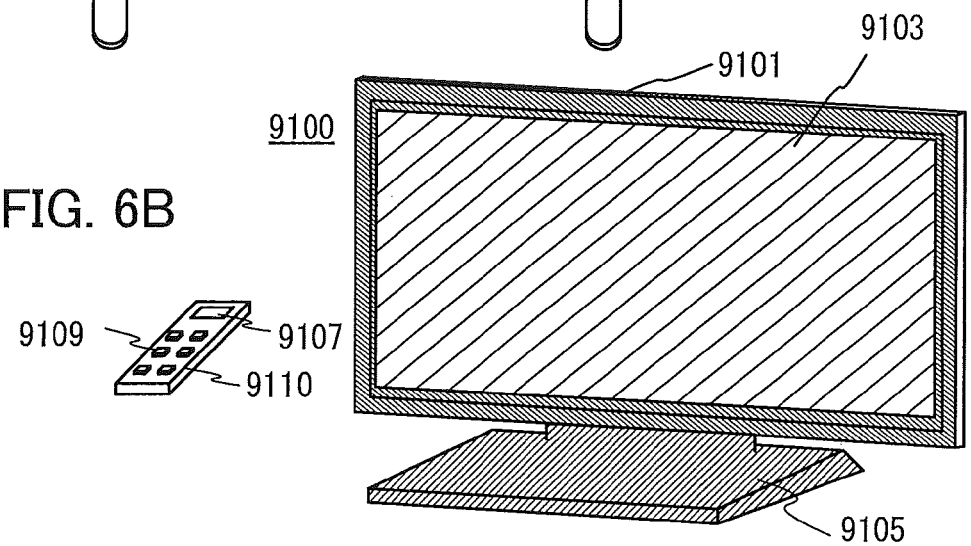

FIG. 6B illustrates a television set 9100. In the television set 9100, a display portion 9103 is incorporated in a housing 9101. A light-emitting device manufactured according to an embodiment of the present invention can be used in the display portion 9103, and an image can be displayed on the display portion 9103. Note that the housing 9101 is supported by a stand 9105 here.

The television set 9100 can be operated with an operation switch provided for the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 6B is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

The light-emitting device including the light-blocking spacer, which is described in the above embodiments, is employed, whereby color mixing, color shift, or the like in display does not easily occur; therefore, when the light-emitting device is used for the display portion 9103 of the television set, the television set can have display quality higher than a conventional television set.

Figure 6C:
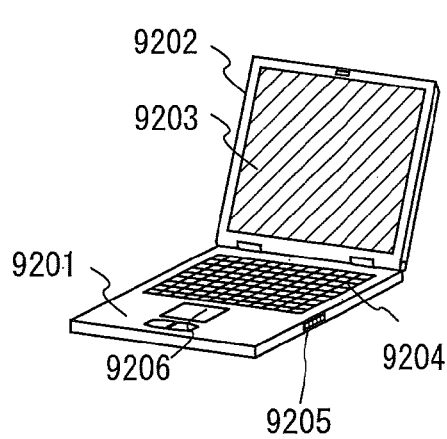

FIG. 6C illustrates a computer which includes a main body 9201, a housing 9202, a display portion 9203, a keyboard 9204, an external connection port 9205, a pointing device 9206, and the like. The computer is manufactured using a light-emitting device manufactured according to an embodiment of the present invention for the display portion 9203.

The light-emitting device including the light-blocking spacer, which is described in the above embodiments, is employed, whereby color mixing, color shift, or the like in display does not easily occur; therefore, when the light-emitting device is used for the display portion 9203 of the computer, the display portion can have display quality higher than a conventional display portion.

Figure 6D:
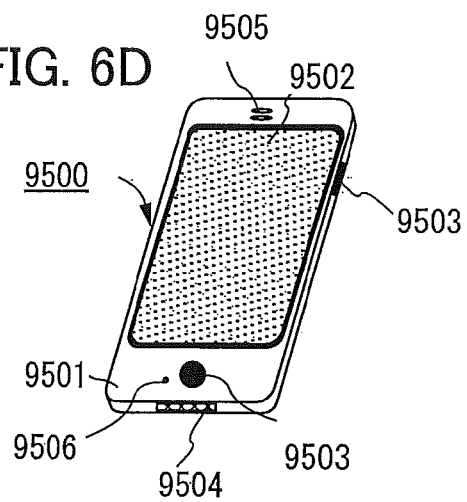

FIG. 6D illustrates an example of a mobile phone. A mobile phone 9500 is provided with a display portion 9502 incorporated in a housing 9501, an operation button 9503, an external connection port 9504, a speaker 9505, a microphone 9506, and the like. Note that the mobile phone 9500 is manufactured using a light-emitting device manufactured according to an embodiment of the present invention for the display portion 9502.

Users can input data, make a call, or text a message by touching the display portion 9502 of the mobile phone 9500 illustrated in FIG. 6D with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. Alternatively, the screen modes can be switched depending on kinds of images displayed on the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source emitting near-infrared light in the display portion, an image of a finger vein, a palm vein, or the like can be taken.

The light-emitting device including the light-blocking spacer, which is described in the above embodiments, is employed, whereby color mixing, color shift, or the like in display does not easily occur; therefore, when the light-emitting device is used for the display portion 9502 of the mobile phone, the mobile phone can have display quality higher than a conventional mobile phone. In addition, the pair of substrates is supported by the light-blocking spacer, so that the light-emitting device is extremely resistant to external force such as impact, distortion, or the like. Thus, the light-emitting device can be favorably used for the mobile phone illustrated in FIG. 6D.

The structures and methods described in this embodiment can be combined as appropriate with any of the structures and methods described in the other embodiments.

This application is based on Japanese Patent Application serial no. 2011-099992 filed with Japan Patent Office on Apr. 27, 2011, the entire contents of which are hereby incorporated by reference.

What is claimed is:

1. A semiconductor device comprising:
    a first substrate;
    a transistor over the first substrate;
    an insulating film over the transistor;
    a first electrode on the insulating film, the first electrode electrically connected to the transistor;
    a partition on the insulating film, the partition covering a periphery of the first electrode;
    a light-blocking spacer on the partition;
    a second electrode covering the light-blocking spacer;
    a second substrate being fixed to the first substrate; and
    first and second black matrixes with a coloring layer positioned therebetween which are in contact with the second substrate,
    wherein a cross-sectional shape of the light-blocking spacer is a trapezoid having a lower side shorter than an upper side,
    wherein the first black matrix covers the light-blocking spacer and is in contact with the second electrode,
    wherein the second black matrix overlaps with the transistor and is not in contact with the second electrode, and
    wherein the coloring layer overlaps with the first electrode.

2. The semiconductor device according to claim 1, wherein a first part of the second electrode, which is formed on a side surface of the light-blocking spacer, is thinner than a second part of the second electrode in a region overlapping with the first electrode.

3. The semiconductor device according to claim 1, wherein a space between the first substrate and the second substrate is a reduced-pressure space.

4. The semiconductor device according to claim 1, wherein a space between the first substrate and the second substrate is filled with an inert gas.

5. The semiconductor device according to claim 1, wherein the first and second black matrixes and the coloring layer are covered with a protective layer comprising an inorganic material.

6. The semiconductor device according to claim 1, wherein the light-blocking spacer comprises a black resin.

7. The semiconductor device according to claim 1, wherein a shape of a top surface of the light-blocking spacer is a linear shape.

8. The semiconductor device according to claim 1, wherein a shape of a top surface of the light-blocking spacer is a net-like shape.

9. A semiconductor device comprising:
    a first substrate;
    a transistor over the first substrate;
    an insulating film over the transistor;
    a first electrode on the insulating film, the first electrode electrically connected to the transistor;
    a partition on the insulating film, the partition covering a periphery of the first electrode;
    a light-blocking spacer over the partition;
    a second electrode covering the light-blocking spacer;
    a second substrate fixed to the first substrate; and
    a first black matrix and a second black matrix adjacent to the first black matrix, the first black matrix and the second black matrix being in contact with the second substrate,
    wherein a cross-sectional shape of the light-blocking spacer is a trapezoid having a lower side shorter than an upper side,
    wherein the first black matrix is in contact with the second electrode,
    wherein the second black matrix is not in contact with the second electrode, and
    wherein a first part of the second electrode, which is formed on a side surface of the light-blocking spacer, is thinner than a second part of the second electrode in a region overlapping with the first electrode.

10. The semiconductor device according to claim 9, wherein a space between the first substrate and the second substrate is a reduced-pressure space.

11. The semiconductor device according to claim 9, wherein a space between the first substrate and the second substrate is filled with an inert gas.

12. The semiconductor device according to claim 9,
wherein the first black matrix overlaps with the light-blocking spacer, and
wherein the second black matrix overlaps with the transistor.

13. The semiconductor device according to claim 9, wherein the light-blocking spacer comprises a black resin.

14. The semiconductor device according to claim 9, wherein a bottom surface of the light-blocking spacer is in contact with the partition.

15. The semiconductor device according to claim 9, wherein a shape of a top surface of the light-blocking spacer is a linear shape.

16. The semiconductor device according to claim 9, wherein a shape of a top surface of the light-blocking spacer is a net-like shape.

17. A semiconductor device comprising:
a first substrate;
an insulating film over the first substrate;
a first electrode on the insulating film;
a partition over the insulating film, the partition covering a periphery of the first electrode;
a spacer having light-blocking property over the partition;
a second electrode covering the spacer;
a second substrate fixed to the first substrate; and
a first black matrix, a second black matrix, and a coloring layer provided between the first black matrix and the second black matrix on the second substrate,
wherein a cross-sectional shape of the spacer is a trapezoid having a lower side shorter than an upper side,
wherein a first part of the second electrode, which is formed on a side surface of the spacer, is thinner than a second part of the second electrode in a region overlapping with the first electrode,
wherein the first black matrix overlaps with the spacer and is in contact with the second electrode,
wherein the second black matrix is not in contact with the second electrode, and
wherein the coloring layer overlaps with the first electrode.

18. The semiconductor device according to claim 17, further comprising a transistor electrically connected to the first electrode over the first substrate.

19. The semiconductor device according to claim 18, wherein the second black matrix overlaps with the transistor.

20. The semiconductor device according to claim 17, wherein a space between the first substrate and the second substrate is a reduced-pressure space.

21. The semiconductor device according to claim 17, wherein a space between the first substrate and the second substrate is filled with an inert gas.

22. The semiconductor device according to claim 17, wherein the first black matrix, the second black matrix, and the coloring layer are covered with a protective layer comprising an inorganic material.

23. The semiconductor device according to claim 17, wherein the spacer comprises a black resin.

24. The semiconductor device according to claim 17, wherein a shape of a top surface of the spacer is a linear shape.

25. The semiconductor device according to claim 17, wherein a shape of a top surface of the spacer is a net-like shape.

* * * * *